(12) United States Patent  
Lenchenkov

(10) Patent No.: US 9,231,013 B2  
(45) Date of Patent: Jan. 5, 2016

(54) RESONANCE ENHANCED ABSORPTIVE COLOR FILTERS HAVING RESONANCE CAVITIES

(71) Applicant: Semiconductor Components Industries, LLC, Phoenix, AZ (US)

(72) Inventor: Victor Lenchenkov, Sunnyvale, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 445 days.

(21) Appl. No.: 13/669,180

(22) Filed: Nov. 5, 2012

(65) Prior Publication Data

US 2013/0119236 A1    May 16, 2013

Related U.S. Application Data

(60) Provisional application No. 61/557,345, filed on Nov. 8, 2011.

(51) Int. Cl.

| | | |
|---|---|---|
| *H01L 27/00* | (2006.01) | |
| *H01J 40/14* | (2006.01) | |
| *H01L 27/146* | (2006.01) | |
| *G01J 3/51* | (2006.01) | |

(52) U.S. Cl.  
CPC .... *H01L 27/14643* (2013.01); *H01L 27/14601* (2013.01); *H01L 27/14621* (2013.01); *H01L 27/14625* (2013.01); *G01J 3/51* (2013.01); *H01L 27/146* (2013.01); *H01L 27/1464* (2013.01); *H01L 27/14627* (2013.01); *H01L 27/14645* (2013.01)

(58) Field of Classification Search  
USPC .............. 250/208.1, 226; 348/294, 302, 311, 348/335, 336–339; 257/290, 291, 294  
See application file for complete search history.

(56) References Cited

U.S. PATENT DOCUMENTS

| | | | | |
|---|---|---|---|---|
| 6,897,120 | B2 | 5/2005 | Trapp | |
| 7,279,764 | B2* | 10/2007 | Mouli | 257/436 |
| 7,822,300 | B2* | 10/2010 | Lee | 385/14 |
| 8,461,659 | B2* | 6/2013 | Kokubun et al. | 257/432 |
| 2007/0007563 | A1 | 1/2007 | Mouli | |
| 2009/0174018 | A1 | 7/2009 | Dungan et al. | |
| 2009/0302407 | A1* | 12/2009 | Gidon et al. | 257/432 |
| 2010/0164042 | A1 | 7/2010 | Manabe | |
| 2010/0253828 | A1* | 10/2010 | Yamada | 348/340 |

* cited by examiner

*Primary Examiner* — Pascal M Bui Pho  
(74) *Attorney, Agent, or Firm* — Treyz Law Group, P.C.; Michael H. Lyons

(57) ABSTRACT

Resonance enhanced color filter arrays are provided for image sensors. Resonance cavities formed with color filter materials that enhance the color filtering capabilities of the color filter materials. Resonance enhanced color filter arrays may be provided for back side illumination image sensors and front side illumination image sensors. A layer of high refractive index material or metamaterial may be provided between a microlens and a color filter material to serve as a first partially reflecting interface for the resonance cavity. An optional layer of high refractive index material or metamaterial may be provided between color filter material and a substrate. In front side illumination image sensors, color filter material may be provided in a light guide structure that extends through interlayer dielectric. The color filter material in the light guide structure may form at least part of a resonance cavity for a resonance enhanced color filter array.

11 Claims, 5 Drawing Sheets

RESONANCE ENHANCED ABSORPTIVE COLOR FILTERS HAVING RESONANCE CAVITIES

This application claims the benefit of provisional patent application No. 61/557,345, filed Nov. 8, 2011 which is hereby incorporated by reference herein in its entirety.

BACKGROUND

This relates generally to imaging devices, and more particularly, image sensors having resonance enhanced absorptive color filters for both back and front side illumination image sensors.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology.

An image sensor may include an active pixel array having photodiodes. A color filler array is often formed over the photodiodes. The color fitter array contains color filters such as red, green, and blue color filters that filter incoming light before it reaches the photodiodes. However, conventional color filter arrays may be susceptible to optical cross talk.

It would therefore be desirable to be able to provide improved color filter arrays for image sensors.

DETAILED DESCRIPTION

Digital camera modules are widely used in electronic devices such as digital cameras, computers, cellular telephones, or other electronic devices. These electronic devices may include image sensors that receive incoming light to capture an image. The image sensors may include arrays of image sensor pixels. The pixels in the image sensors may include photosensitive elements such as photodiodes that convert the incoming light into digital data. Image sensors may have any number of pixels (e.g., hundreds or thousands or more). A typical image sensor may, for example, have millions of pixels (e.g., megapixels). In high-end equipment, image sensors with ten megapixels or more are not uncommon.

Image sensors in digital cameras and other digital imaging devices typically have an array of pixels. Each pixel may have an associated color filter of for example, red, green, or blue. Color filter array 20 of FIG. 1 has individual color filters 12 arranged such that half the filters are green, a quarter of the filters are red, and a quarter of the filters are blue. The color filter pattern of FIG. 1 may be known as a Bayer pattern. Other suitable color filter patterns may also be used for color filter arrays. Color filter array 20 of FIG. 1 may be a resonance enhanced absorptive color filter array. A resonance enhanced absorptive color filter array may also be known as a resonance enhanced color filter array.

In a resonance cavity, incoming light forms a standing wave between two reflectors. One or both of the reflectors may be only partially reflective in order to allow incoming light to enter or leave the resonance cavity. Each resonance enhanced color filter 12 in color filter array 20 may serve as a resonance cavity. The resonance cavity may be an absorptive resonance cavity. Multiple passes of light within the resonance cavity may result in absorptive side bands. For a green color filter, green light may be transmitted while red and blue light may be absorbed in absorption side bands. For a red color filter, red light may be transmitted while blue and green light may be absorbed. For a blue color filter, blue light may be transmitted while red and green light may be absorbed. Absorbed light may generate electrons and holes within the color filter material. A depletion region may form within the color filter material.

Interfaces between the color filter material and adjacent layers may form opposing partially reflective interfaces for a resonance cavity. Partial reflectors and reflective interfaces may be made based on 1) Fresnel index contract reflections between different semiconductor materials; 2) Additional semiconductor material layers(s); 3) Plasmon-based 3D structures 4) Photonic band gap filter structures; 5) geometrically set up resonators; or 6) a combination of any of 1-5 with absorption filters.

Figure 2:
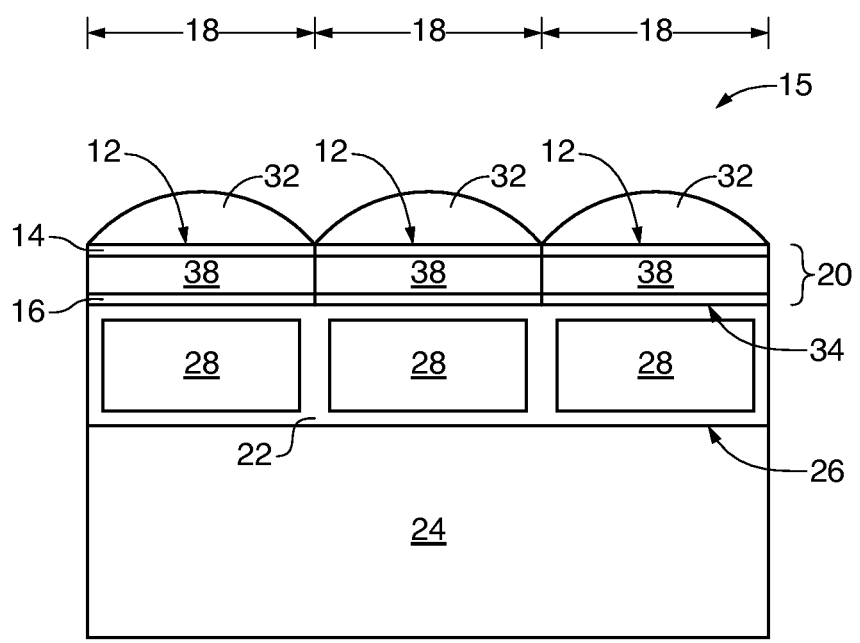
FIG. 2 is a diagram of an illustrative back side illumination image sensor having a resonance enhanced color filter array in accordance with an embodiment of the present invention.

A cross-sectional side view of an illustrative back side illumination (BSI) image sensor that may have resonance enhanced color filter arrays is shown in FIG. 2. Image sensor 15 of FIG. 2 may have a pixel array with pixels 18. Substrate 22 may be substrate such as silicon or p-type silicon. Substrate 22 may include an epitaxial layer. Substrate 22 may have a thickness in a range of about 1.5 microns to 3 microns. A dielectric stack 24 may be formed on front surface 26 of substrate 22. Dielectric stack 24 may have alternating metal and dielectric layers. Metal interconnects may be formed in metal layers in dielectric stack 24. Metal interconnects may be formed from a suitable metal such as copper or aluminum. Dielectric layers may include metal vias. Dielectric layers may also be known as via layers. Dielectric stack may have, for example, two or more metal layers, four or more metal layers, six or more metal layers, or other suitable numbers of metal layers. Dielectric stack 24 may also be known as interlayer dielectric. Metal layer and via layers may be known as interconnect layers.

Each pixel 18 has a photodiode 28 formed in a front side 26 of silicon substrate 48. A resonance enhanced color filter array 20 may be formed on back surface 34 of substrate 22. Microlenses 32 may be formed in an array over color filter array 20.

Light can enter from the back side of the image sensor pixels through microlenses 32. Photons incident on photodiodes 28 may be converted into charge that is output as pixel signals.

Resonance enhanced color filters 12 in color filter array 20 may have color filter material 38. A resonance cavity may be formed in each color filter 12. A resonance cavity may be formed in color filter material 38 between interfaces between color filter 38 and adjacent materials. A layer 14 may be provided between color filter material 38 and microlenses 32. Layer 14 may serve as a partially reflecting interface for a resonance cavity. Alternatively, an interface between layer 14 and color filter material 25 may serve as a partially reflecting interface for a resonance cavity.

Layer 14 may be a material with a higher refractive index than color filter material 38. Layer 14 may have a refractive index in a range of 1.4 to 4.5, over 2.0, or in another suitable range. Layer 14 may be a high refractive index material such as silicon, silicon oxide, silicon nitride, silicon carbide, titanium oxide, tin oxide, germanium, or other suitable materials. Color filter material may have a refractive index of about 1.6, or in a range of 1.0 to 2.0. An interface between a high refractive index material 14 and color filter material 38 may serve as a partially reflecting interface for a resonance cavity.

If desired, layer 14 may be formed from a metamaterial. A metamaterial layer may have features of about 100-200 nm in size. Layer 14 may be a plasmonic metamaterial or a bandgap metamaterial. A plasmonic metamaterial may have metal embedded in a dielectric. A bandgap metamaterial may have two alternating dielectrics. Types of metal that may be used in a plasmonic metamaterial include aluminum, copper, silver, titanium, tungsten, or other suitable metals. Types of dielectrics that may be used for plasmonic or bandgap metamaterials include silicon, silicon oxide, silicon, nitride, silicon carbide, titanium oxide, tin oxide, germanium, or other suitable dielectrics.

A layer 16 may be provided between color filter material 38 and substrate 22. A partially reflective interface may be formed between color filter material 38 and substrate 22. Layer 16 may be a high refractive index material or a metamaterial. Alternatively, layer 16 may be omitted and an interface between color filter material 38 and substrate 22 may serve as a partially reflecting interface for the resonance cavity.

If desired, layer 16 may be included in resonance enhanced color filter 12 and layer 14 omitted. If layer 14 is omitted, an interface between color filter material 38 and microlenses 32 may serve as a partially reflecting interlace for a resonance cavity.

Resonance enhanced color filters 12 may be made thinner than conventional color filters. It may be advantageous to have thinner color filters in order to better handle incident light having chief ray angles that are off from vertical. Resonance enhanced color filter 12 may have a thickness of e.g., about 200 nm, 150-250 nm, less than 300 nm, or other suitable thicknesses. A resonance color filter array 20 may have a uniform thickness. If desired, a resonance enhanced color filler array 20 may be formed having color filters 12 with different thickness for different colors.

Figure 1:
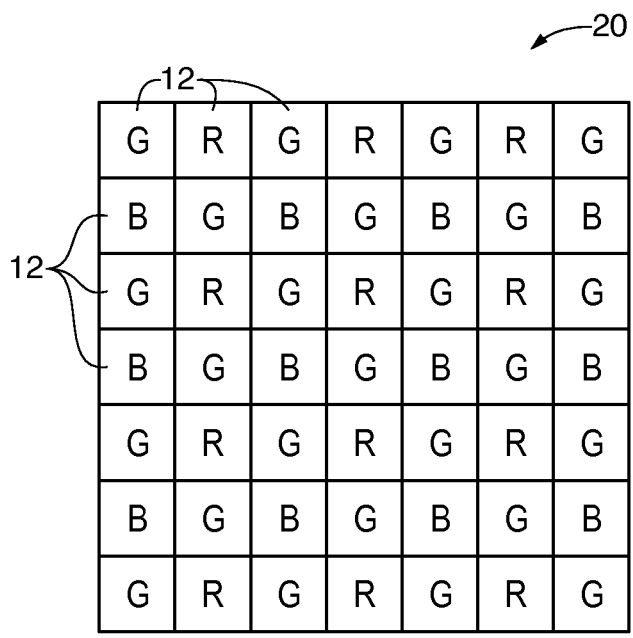
FIG. 1 is a diagram of an illustrative resonance enhanced color filter array having a Bayer pattern in accordance with an embodiment of the present invention.
Figure 3:
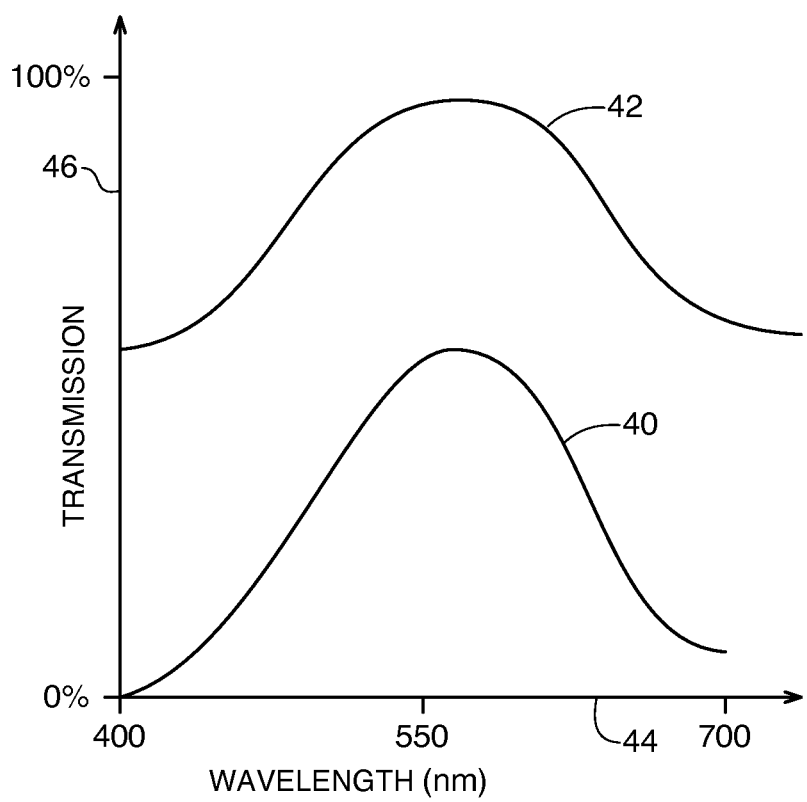
FIG. 3 is a diagram of an illustrative plot showing increased color filtering capabilities of resonance enhanced color filler arrays in accordance with an embodiment of the present invention.

FIG. 3 is an illustrative plot of how filtering capabilities may be improved for resonance enhanced color filters such as color filter 12 in FIGS. 1 and 2. The plot of FIG. 3 has wavelength in nanometers on horizontal axis 44 and transmission in percentages on vertical axis 46. Curve 42 may represent a typical transmission curve for a 150 nm-thick conventional absorptive green color filter, having a maximum at around 550 nm. Curve 40 may represent a transmission curve for a resonance enhanced green color fitter of the same 150 nm thickness, such as color filter 12. Curve 40 has reduced transmission in red (approx. 400 nm) and blue (700 nm) wavelengths, indicating that these colors, which are undesirable for green pixels, have been, filtered out.

Figure 4:
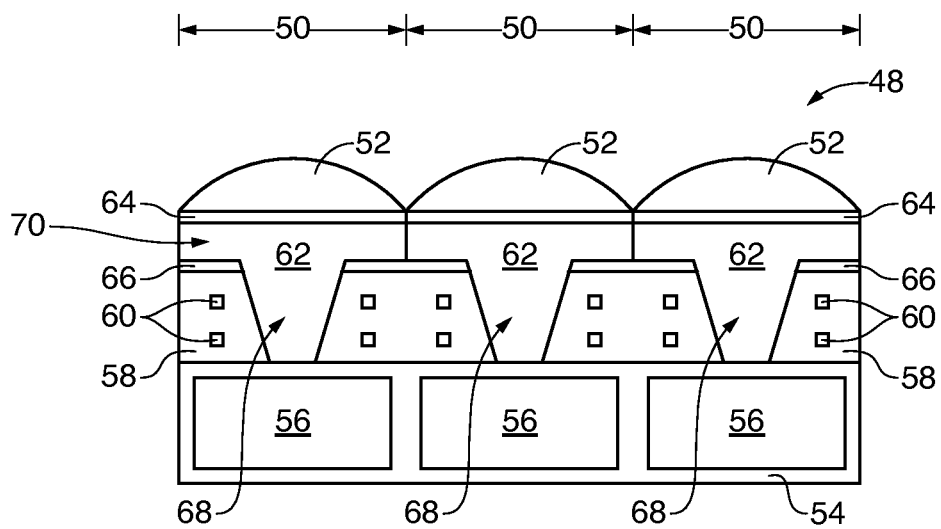
FIG. 4 is a diagram of an illustrative front side illumination image sensor having a resonance enhanced color filter array in accordance with an embodiment of the present invention.

FIG. 4 is an illustrative diagram of a front side illumination image sensor 48 that may have resonance enhanced color filter arrays. Image sensor 48 may have a substrate 54 having photodiodes 56. A photodiode 56 is provided for each pixel 50. Interlayer dielectric 58 may be formed on substrate 54. Interlayer dielectric 58 may have metal interconnects 60. Color filter material 62 may fill a light guide structure 68 that extends through interlayer dielectric 58. Light guide structure 68 may be substantially conical in shape. Color filter material 62 may also fill a color filter layer 70 over light guide structures 68. A layer 64 may be formed between color layer material 62 and microlens 52. Layer 64 may be a high refractive index material or a metamaterial. A layer 66 may be formed between color filter material 62 and interlayer dielectric 58. In the example of FIG. 4, a resonance cavity may be formed from light guide structure 68 and color filter layer 70.

Figure 5A:
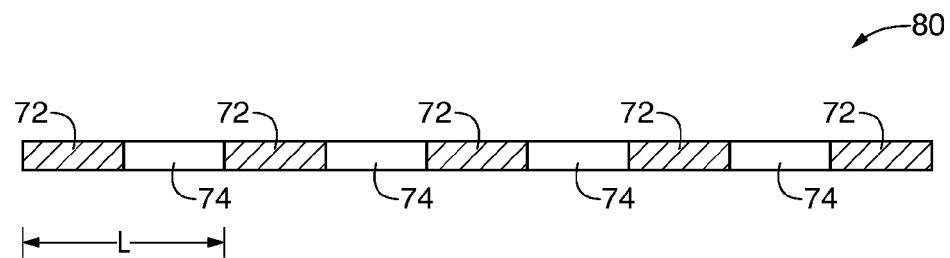
FIG. 5A is a diagram of an illustrative plasmonic metamaterial layer that may be used in a resonance enhanced color filter array in accordance with an embodiment of the present invention.

FIG. 5A is an illustrative diagram of a plasmonic metamaterial 80 that may be used for the resonance enhanced color filters of FIGS. 1, 2, and 4. For example, plasmonic metamaterial 80 may be used for layers 14 or 16 of back side illumination image sensor 15 in FIG. 2, or layers 64 or 66 in front side illumination image sensor 48 in FIG. 4. In the example of FIG. 5A, metal 72 may alternate with dielectric 74. Metal 72 may be a metal such as aluminum, copper, silver, titanium, tungsten, or other suitable metals. Dielectric 74 may be a material such as silicon, silicon oxide, silicon nitride, silicon carbide, titanium oxide, tin oxide, germanium, or other suitable dielectrics. Metal structures 72 may have a periodicity L hat is approximately one tenth of the wavelength of visible light. Metal structures 72 may have a periodicity of about 100-200 nm.

Figure 5B:
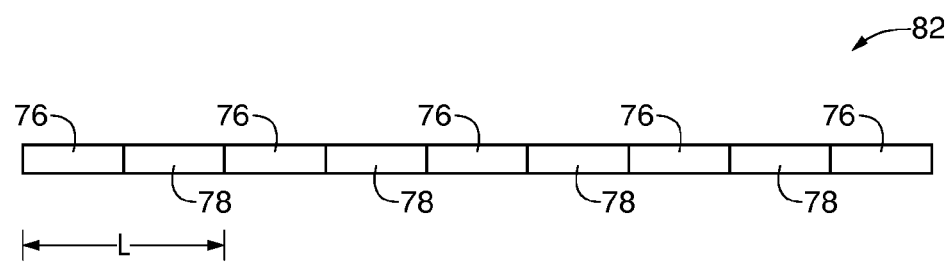
FIG. 5B is a diagram of an illustrative bandgap metamaterial layer that may be used in a resonance enhanced color filter array in accordance with an embodiment of the present invention.

FIG. 5B is an Illustrative diagram of a bandgap metamaterial 82 that may be used for the resonance enhanced color filters of FIGS. 1, 2, and 4. For example, bandgap metamaterial 82 may be used for layers 14 or 16 of back side illumination image sensor 15 in FIG. 2, or layers 64 or 66 in front side illumination image sensor 48 in FIG. 4. Bandgap metamaterial 82 may have alternating dielectrics materials 76 and 78. Dielectric materials 76 and 78 may be formed from, e.g., silicon, silicon oxide, silicon nitride, silicon carbide, titanium oxide, tin oxide, germanium, or other suitable dielectrics.

Back side illumination sensors may also be provided with color filter material on a front side 26 of a substrate as well as on a back side 34 of a substrate (see, e.g., FIG. 2).

Figure 6A:
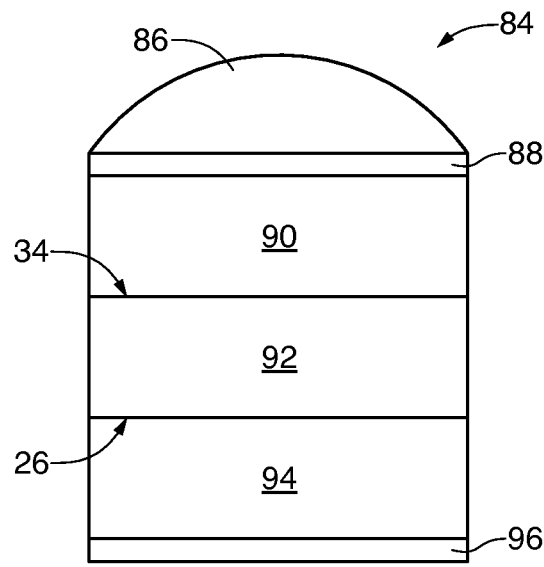
FIG. 6A is a diagram of an illustrative back side illumination pixel having color filter material on both a front side and a back side of a substrate in accordance with an embodiment of the present invention.

FIG. 6A is an illustrative diagram of a back side illumination image sensor pixel 84. Pixel 84 has substrate 92, a color fitter 90 on a back side 34 of substrate 92, and a color filter 94 on a front side 26 of substrate 92. A resonance cavity may be formed that extends through color filter 90, substrate 92, and color filter 94. Layer 88 between color filter 90 and microlens 86 may be a layer such as layer 14 of FIG. 2. Layer 88 may form a partially reflecting interface. Layer 96 adjacent to color filter 94 may form a partially reflecting interface, or may be formed from a metal and be a fully reflecting interface.

Figure 6B:
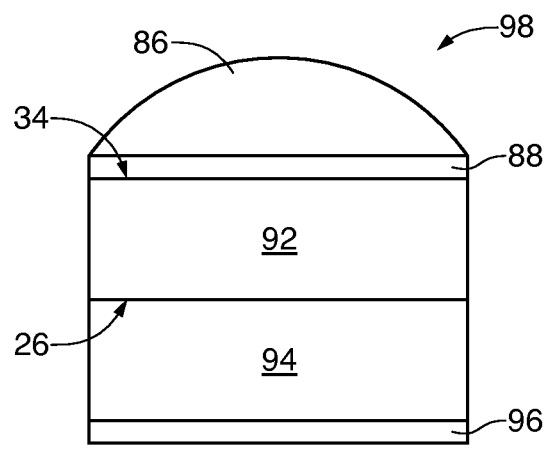
FIG. 6B is a diagram of an illustrative back side illumination pixel having color filler material only on a front side of a substrate in accordance with an embodiment of the present invention.

FIG. 6B is an illustrative diagram of a back side illumination image sensor pixel 98. In the example of FIG. 6B, color filter 90 has been omitted. Substrate 92 and color filter 94 on a front side 26 of substrate 92 may form a resonance cavity.

Figure 7:
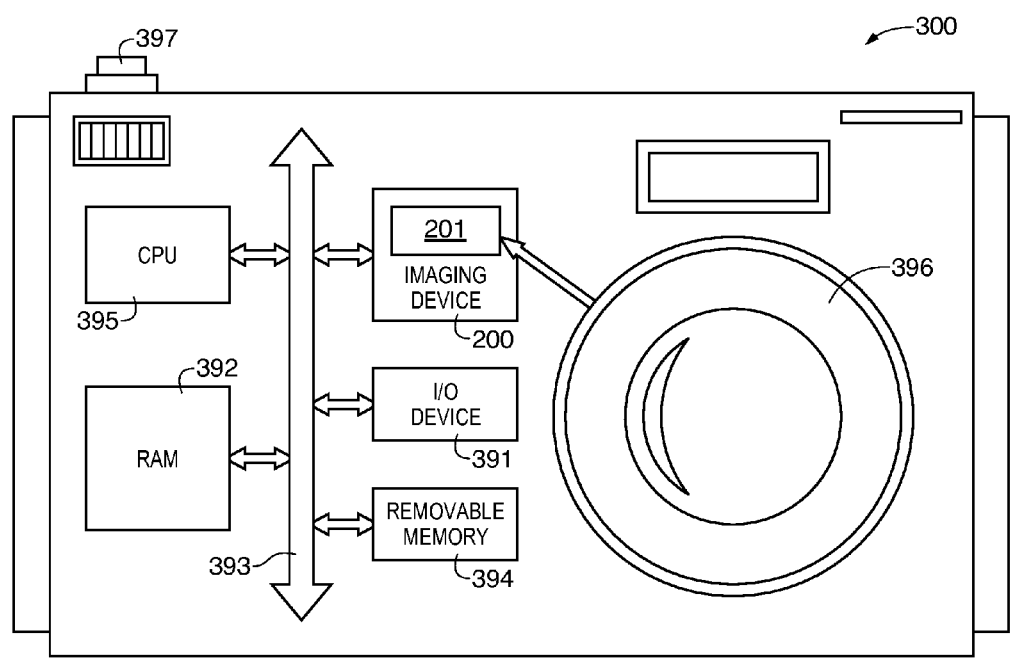
FIG. 7 is a block diagram of a processor system employing a back side or front side illumination sensor of FIGS. 1-6 in accordance with an embodiment of the present invention.

FIG. 7 shows in simplified form a typical processor system 300, such as a digital camera, which includes an imaging device such as imaging device 200 employing an image sensor having resonance enhanced color filter array of FIGS. 1-6. Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Pixel array 201 may resonance enhanced color filter array of FIGS. 1-6. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating resonance enhanced color filter arrays.

Resonance enhanced color filter arrays are provided for image sensors. Resonance cavities are formed with color filter materials that enhance the color filtering capabilities of the color filter materials.

Resonance enhanced color filter arrays may be provided for back side illumination image sensors. A layer of high refractive index material or metamaterial may be provided between a microlens and a color filter material to serve as a first partially reflecting interface for the resonance cavity. An optional layer of high refractive index material or metamaterial may be provided between color filter material and a substrate.

Resonance enhanced color filter arrays may be provided for front side illumination image sensors. Front side illumination image sensors may have a light guide structure formed in interlayer dielectric that guides light to photodiodes in a substrate. Color filter material may be provided in a light guide structure. The color filter material in the light guide structure may form at least part of a resonance cavity for a resonance enhanced color filter array. A color filter array layer may also be provided that together forms a resonance cavity with the light guide structure.

Back side illumination sensors may also be provided with color filter material on a front side of a substrate as well as on a back side of a substrate. Color filter material on a front side of a substrate may form a resonance cavity together with a substrate layer and color filter material on a back side of a substrate. If desired, color filter material on a front side of substrate may form a resonance cavity together with a substrate layer, and color filter material on a back side of the substrate may be omitted.

The foregoing is merely illustrative of the principles of this invention which can be practiced in other embodiments.

What is claimed is:

1. An image sensor, comprising;
an array of photodiodes in a substrate;
color filter material in a color filter array;
a microlens array; and
a metamaterial layer between the color filter material and the microlens array, wherein a resonance cavity is formed at least partly from the color filter material and a first partially-reflecting interface between the color filter material and the metamaterial layer, and wherein the color filter array is formed between the microlens array and the substrate on a first side of the substrate, wherein the image sensor further includes an additional color filter array with an additional resonance cavity on a second side of the substrate.

2. The image sensor defined in claim 1, wherein the metamaterial comprises a bandgap metamaterial.

3. The image sensor defined in claim 1, wherein the metamaterial comprises a plasmonic metamaterial.

4. The image sensor defined in claim 1, wherein a portion of the resonance cavity is formed from the substrate.

5. The image sensor defined in claim 1, wherein the resonance cavity is also formed from a second partially-reflecting interface between the color filter material and the substrate.

6. The image sensor defined in claim 1, further comprising an additional metamaterial layer between the color filter material and the substrate, wherein the resonance cavity is also formed from a second partially-reflecting interface between the color filter material and the additional metamaterial layer.

7. The image sensor defined in claim 1, wherein the image sensor comprises a back side illumination image sensor and wherein the second interface is interposed between the color filter material and the substrate.

8. A system, comprising:
a central processing unit;
memory;
input-output circuitry; and
an imaging device, wherein the imaging device comprises:
    a pixel array in a substrate; and
    a resonance enhanced color filter array, wherein the color filter array forms at least part of a resonance cavity, and wherein the resonance enhanced color filter array comprises at least one layer of metamaterial, wherein the metamaterial comprises periodic structures having a periodicity of about 100 nm to 200 nm.

9. The system defined in claim 8, wherein the resonance enhanced color filter array comprises:
color filter material; and
a patterned 3D band gap filter in the color filter material.

10. The system defined in claim 8, wherein the resonance enhanced color filter array comprises at least one layer of material having a refractive index of two or higher.

11. The system defined in claim 8, wherein the resonance enhanced color filter array comprises color filter material having a thickness of less than 300 nm.

* * * * *